US008629370B2

(12) United States Patent
Tavassoli et al.

(10) Patent No.: US 8,629,370 B2
(45) Date of Patent: Jan. 14, 2014

(54) ASSEMBLY FOR DELIVERING RF POWER AND DC VOLTAGE TO A PLASMA PROCESSING CHAMBER

(75) Inventors: Hamid Tavassoli, Cupertino, CA (US); Surajit Kumar, Sunnyvale, CA (US); Shane C. Nevil, Livermore, CA (US); Douglas A. Buchberger, Jr., Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 462 days.

(21) Appl. No.: 13/085,070

(22) Filed: Apr. 12, 2011

(65) Prior Publication Data

US 2011/0297650 A1 Dec. 8, 2011

Related U.S. Application Data

(60) Provisional application No. 61/393,716, filed on Oct. 15, 2010, provisional application No. 61/352,779, filed on Jun. 8, 2010, provisional application No. 61/362,232, filed on Jul. 7, 2010, provisional application No. 61/393,698, filed on Oct. 15, 2010.

(51) Int. Cl.
*H05H 1/46* (2006.01)

(52) U.S. Cl.
USPC ............ 219/121.41; 219/121.43; 219/121.54; 118/723 E; 118/728; 156/345.45; 156/345.48; 156/345.51

(58) Field of Classification Search
CPC ........................................................ H05H 1/46
USPC ............... 219/121.4, 121.41, 121.43, 121.54; 118/723 R, 723 E, 728; 156/345.45, 156/345.48, 345.51
See application file for complete search history.

(56) References Cited

U.S. PATENT DOCUMENTS

| | | | | |
|---|---|---|---|---|
| 6,367,413 | B1 * | 4/2002 | Sill et al. | 118/723 E |
| 2008/0308014 | A1 * | 12/2008 | Costa et al. | 106/802 |
| 2012/0000605 | A1 * | 1/2012 | Kellogg et al. | 156/345.1 |
| 2013/0112666 | A1 * | 5/2013 | Koshiishi et al. | 219/121.4 |

* cited by examiner

*Primary Examiner* — Mark Paschall
(74) *Attorney, Agent, or Firm* — Blakely, Sokoloff, Taylor & Zafman LLP

(57) ABSTRACT

A triaxial rod assembly for providing both RF power and DC voltage to a chuck assembly that supports a workpiece in a processing chamber during a manufacturing operation. In embodiments, a rod assembly includes a center conductor to be coupled to a chuck electrode for providing DC voltage to clamp a workpiece. Concentrically surrounding the center conductor is an annular RF transmission line to be coupled to an RF powered base to provide RF power to the chuck assembly. An insulator is disposed between the center conductor and RF transmission line. Concentrically surrounding the RF transmission line is a ground plane conductor coupled to a grounded base of the chuck to provide a reference voltage relative to the DC voltage. An insulator is disposed between the RF transmission line and the ground plane conductor.

20 Claims, 4 Drawing Sheets

220 143 350 340 222 224 141 226 141 144 145 145 146 146 142 147 147 147B 147B 228 230A 230A 230B 128 228 222 226 224 380 U U'

ASSEMBLY FOR DELIVERING RF POWER AND DC VOLTAGE TO A PLASMA PROCESSING CHAMBER

REFERENCE TO RELATED APPLICATIONS

This application claims the benefit of U.S. Provisional Patent Application No. 61/393,716 filed on Oct. 15, 2010, entitled "ASSEMBLY FOR DELIVERING RF POWER AND DC VOLTAGE TO A PLASMA PROCESSING CHAMBER," the entire contents of which are hereby incorporated by reference herein.

This application is related to U.S. Provisional Application No. 61/352,779 filed on Jun. 8, 2010, entitled "PULSED-COOLING CHILLER FOR PLASMA PROCESSING APPARATUS"; U.S. Provisional Application No. 61/362,232 filed on Jul. 7, 2010, entitled "TEMPERATURE CONTROL IN PLASMA PROCESSING APPARATUS USING PULSED HEAT TRANSFER FLUID FLOW"; U.S. Provisional Application No. 61/393,698 filed on Oct. 15, 2010, entitled "MULTI-ZONED PLASMA PROCESSING ELECTROSTATIC CHUCK WITH IMPROVED TEMPERATURE UNIFORMITY"; and U.S. Utility application Ser. No. 13/081,412 filed on Apr. 6, 2011, entitled "MULTI-ZONED PLASMA PROCESSING ELECTROSTATIC CHUCK WITH IMPROVED TEMPERATURE UNIFORMITY."

FIELD

Embodiments of the present invention relate to the electronics manufacturing industry and more particularly to coupling power into an electrostatic chuck for supporting a workpiece during plasma processing.

DISCUSSION OF RELATED ART

Power density in plasma processing equipment, such as those designed to perform plasma etching of microelectronic devices and the like, is increasing with the advancement in fabrication techniques. For example, powers of 5 to 10 kilowatts are now in use for 300 mm substrates. With the increased power densities, enhanced cooling of a chuck is beneficial during processing to control the temperature uniformity of a workpiece. Chucks may be designed with a thinner top dielectric layer (also referred to as a puck) to reduce thermal resistance and time constant characteristics of the chuck top surface.

For conventional chucks having a thick dielectric layer forming the chuck top surface, a single electrode may be embedded within the puck. The single electrode is both RF powered and biased with a DC clamping voltage while an immediately subjacent base is maintained at ground potential. Reducing the thickness of the dielectric layer may increase shunt capacitances. As such, one or more of the chucks described in U.S. Provisional Patent Application 61/362,232 provide electrostatic clamping with a DC biased, but RF floating electrode embedded within the dielectric layer while a subjacent base is RF powered. Delivering RF power and DC voltage into chucks with a clamping electrode distinct from the RF electrode is difficult at least in part because of ground arcing concerns.

SUMMARY

Embodiments of the present invention include a rod assembly for providing both RF power and DC voltage to a chuck that supports a workpiece in a processing chamber, such as a plasma etch or plasma deposition chamber, during a manufacturing operation. In embodiments, a chuck assembly includes a dielectric layer with a top surface to support the workpiece. Embedded within the dielectric layer is a DC biased, but RF floating chuck electrode for electrostatically holding a workpiece to the chuck. Disposed below the dielectric layer is an RF powered electrode, disposed below the RF powered electrode is a base at ground potential separated from the RF powered electrode by an insulator.

In embodiments, a DC/RF rod assembly includes a center conductor to be coupled to the chuck electrode. Concentrically surrounding the center conductor is an annular RF transmission line to be coupled to the RF powered electrode. An insulator is disposed between the center conductor and the RF transmission line. Concentrically surrounding the RF transmission line is a ground plane conductor to be coupled to the grounded base of the chuck. An insulator is disposed between the RF transmission line and the ground plane conductor. In embodiments, the center conductor is a relatively thin wire and may be made of brass for stiffness and/or toughness. In further embodiments, the RF transmission line may be of a highly conductive metal, such as copper and may also be gold plated. In embodiments, the ground plane conductor may provide a rigid outer shell, of for example of aluminum, which may be removably affixed to the bottom side of the chuck assembly to hold the center conductor and RF transmission lines in seats within a recess along a central axis of the chuck assembly.

In embodiments, the RF/DC rod assembly is a rigid assembly which may be seated into a chuck assembly of a processing chamber with the center conductor extending along an axial distance past the RF powered electrode to couple a DC power supply of the processing chamber with the chuck electrode. An outer circumference of the RF transmission line may be seated in contact with an inner surface of the RF powered electrode to couple an RF power supply of the processing chamber to the RF powered electrode. The ground plane conductor may be seated in contact with a bottom surface of the grounded base in the chuck.

DETAILED DESCRIPTION

In the following description, numerous specific details are set forth to provide a thorough understanding of the present invention. It will be apparent to one skilled in the art that the present invention may be practiced without these specific details. In other instances, well-known features, such as specific chambers, materials, and machining/assembly techniques, are not described in detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (e.g., as in a cause an effect relationship).

Triaxial arrangements of DC and RF conductors in an RF/DC rod assembly are described to supply separate DC and RF power within a chuck assembly. The triaxial architectures reduce the likelihood of arcing between an electrode having a high DC potential (e.g., 250V-500V and above) and the ground electrode while also providing an RF transmission line (e.g., having approximately 50 ohm characteristic impedance) in a compact form factor which can be readily seated with mating surfaces of a chuck assembly.

Figure 1:
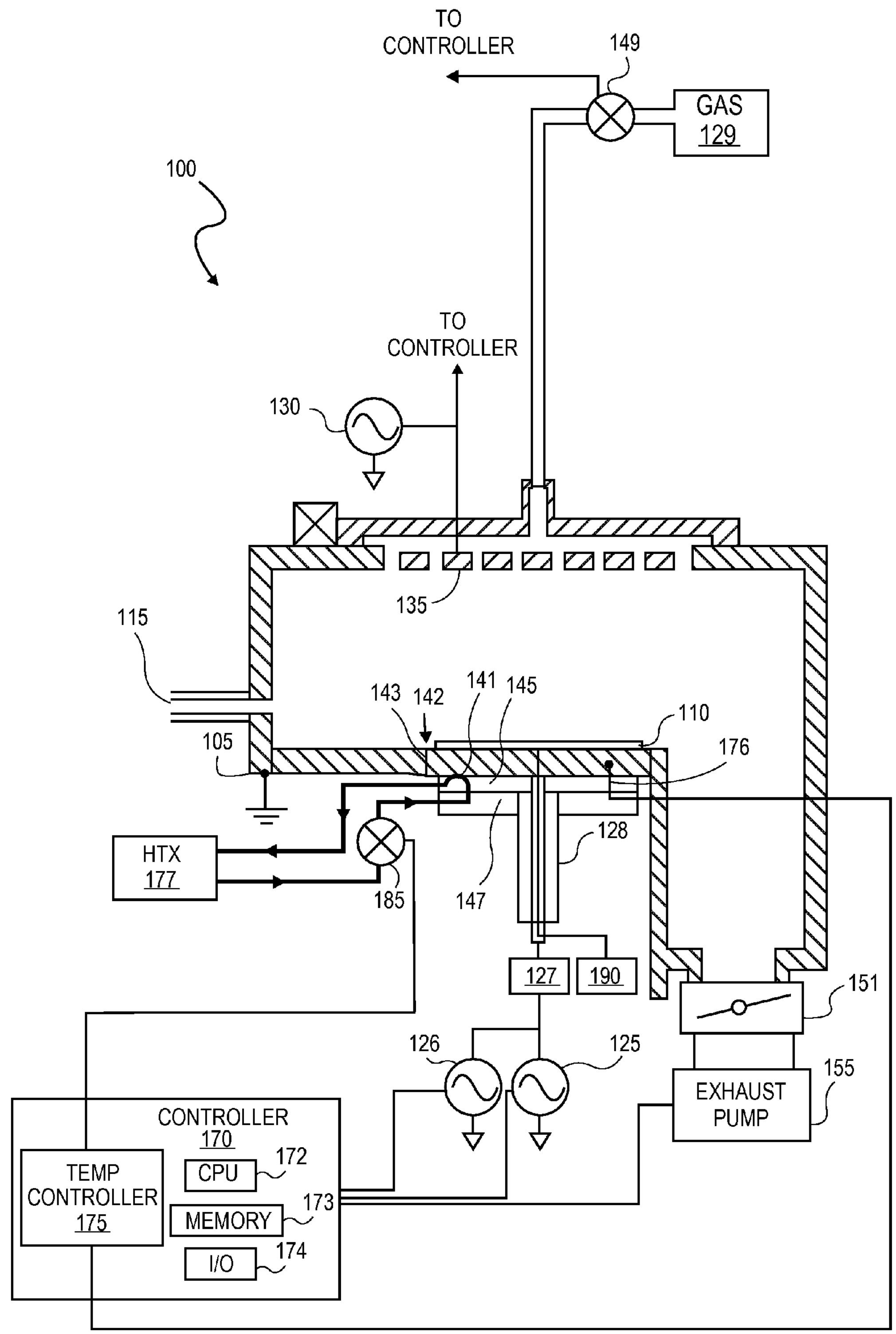
FIG. 1 is a schematic of a plasma etch system including an RF/DC rod assembly in accordance with an embodiment of the present invention.

FIG. 1 is a schematic of a plasma etch system 100 including an RF/DC rod assembly 128 in accordance with an embodiment of the present invention. The plasma etch system 100 may be any type of high performance etch chamber known in the art, such as, but not limited to, Enabler™ MxP®, MxP+™, Super-E™, DPS II AdvantEdge™ G3, or E-MAX® chambers manufactured by Applied Materials of CA, USA. Other commercially available etch chambers may similarly utilize chuck assemblies as described herein. While the exemplary embodiments are described in the context of the plasma etch system 100, the RF/DC rod assembly described herein is also adaptable to other processing systems used to perform any substrate fabrication process (e.g., plasma deposition systems, etc.) which uses an electrostatic chuck.

Referring to FIG. 1, the plasma etch system 100 includes a plasma chamber 105. A workpiece 110 is loaded through an opening 115 and clamped to a chuck assembly 142. The workpiece 110 may be any conventionally employed in the plasma processing art and the present invention is not limited in this respect. The workpiece 110 is disposed on a top surface of a dielectric layer 143 disposed over an RF powered base 145 and grounded plane 147. In particular embodiments, chuck assembly 142 includes a heat transfer fluid conduit 141. Process gases, are supplied from gas source(s) 129 through a mass flow controller 149 to the interior of the plasma chamber 105. Plasma chamber 105 is evacuated via an exhaust valve 151 connected to a high capacity vacuum pump stack 155.

As shown in FIG. 1, the RF/DC rod assembly 128 provides a DC voltage to the chuck assembly 142 from the DC voltage supply 190 to electrostatically clamp the workpiece 110 to a top surface of the chuck dielectric layer 143. In embodiments, the DC voltage supply 190 is to provide voltages of 250V-500V, or more. When plasma power is applied to the chamber 105, a plasma is formed in a processing region over workpiece 110. A plasma bias power 125 is coupled into the chuck assembly 142 via the RF/DC rod assembly 128 to energize the plasma. The plasma bias power 125 typically has a low frequency between about 2 MHz and 60 MHz, and may be for example in the 13.56 MHz band. In the exemplary embodiment, the plasma etch system 100 includes a second plasma bias power 126 operating at about 2 MHz which is connected to the same RF match 127 as plasma bias power 125. A plasma source power 130 is coupled through a match (not depicted) to a plasma generating element 135 to provide high frequency source power to inductively or capacitively energize the plasma. The plasma source power 130 may have a higher frequency than the plasma bias power 125, such as between 100 and 180 MHz, and may for example be in the 162 MHz band.

The temperature controller 175 is to execute temperature control algorithms. The temperature controller 175 is to output control signals affecting the rate of heat transfer between the chuck assembly 142 and a heat source and/or heat sink external to the plasma chamber 105. The temperature controller 175 may further comprise a component or module of the system controller 170 responsible for management of the plasma etch system 100 through a central processing unit 172, memory 173 and input/output interface 174. In the exemplary embodiment, the temperature controller 175 is coupled to at least one heat exchanger (HTX)/chiller 177 and controls heat transfer fluid flow rate through fluid conduits in the chuck assembly 142, as well as the temperature of the heat transfer fluid. One or more valves 185 (or other flow control devices) between the heat exchanger/chiller and fluid conduits in the chuck assembly may be controlled by temperature controller 175 to independently control a rate of flow of the heat transfer fluid on the basis of one or more temperature sensors 176.

Figure 2:
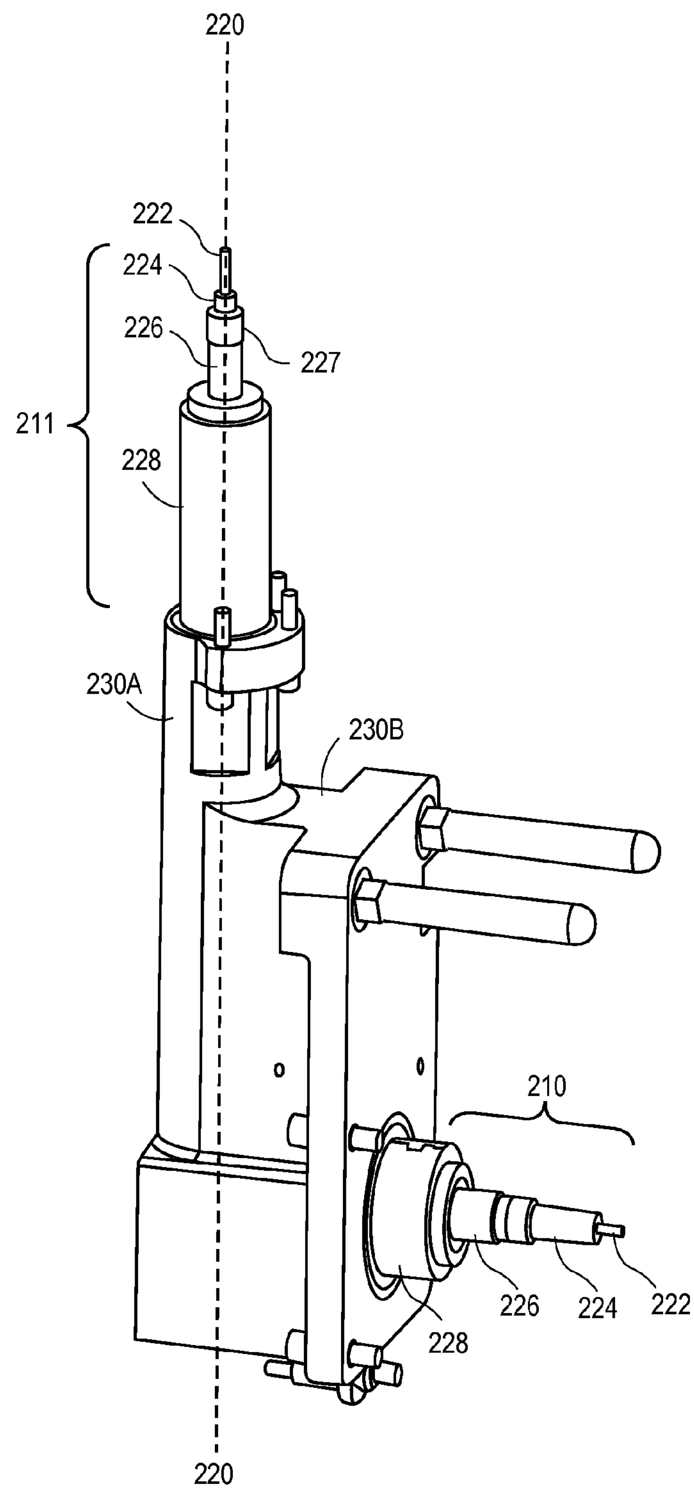
FIG. 2 illustrates an isometric view of external surfaces and ends of an RF/DC rod assembly, in accordance with an embodiment of the present invention.

FIG. 2 illustrates an isometric view of external surfaces and terminals of the RF/DC rod assembly 128, in accordance with an embodiment of the present invention. The RF/DC rod assembly 128 includes rod assembly input terminals 210 through which the RF/DC rod assembly is to be coupled to the plasma bias power source(s) 125 (126) and DC voltage supply 190 (FIG. 1). The RF/DC rod assembly 128 is to be coupled to various electrodes in the chuck assembly 142 (as shown in FIG. 1) via chuck terminals 211 disposed at an end opposite the rod assembly input terminals 210. As shown, the RF/DC rod assembly 128 is triaxial with three conductors concentric about a central axis 220. A center conductor 222 is concentrically surrounded by an RF transmission line 226 forming an annulus or tube around the center conductor 222. A first insulator 224 is disposed between the center conductor 222 and the RF transmission line 226. A ground plane conductor 230A forming a second annulus or tube concentrically surrounds the RF transmission line 226 along an axial length of the rod assembly 128. A second insulator 228 is disposed between the RF transmission line 226 and ground plane conductor 230A. In the exemplary embodiment depicted, the ground plane conductor 230A may further include a bulkhead 230B to rigidly support a right angle bend in the center conductor 222 and RF transmission line 226. The bulkhead 230B may further provide a means to couple the RF/DC rod assembly 128 to a platform frame and/or the plasma bias power source(s) 125 (126) and DC voltage supply 190.

As further shown in FIG. 2, at central axis 220, the center conductor 222 extends an axial length beyond an annular end of a first insulator 224 with the first insulator 224 extending an axial length beyond an annular end of the RF transmission line 226. The RF transmission line 226 extends an axial length beyond the annular end of the second insulator 228, which in turn, extends beyond an annular end of the ground plane conductor 230A. The center conductor 222 and RF transmission line 226 may be of any conductive metal conventional in the art for such purposes, for example copper or gold. Additionally, the center conductor 222 or RF transmission line 226 may be a single filaments/bulk materials or multi-stranded/composite conductors.

In the exemplary embodiment, the RF transmission line 226 is to have approximately 50 ohm characteristic impedance. In particular embodiments, the center conductor 222 is a wire having an outer diameter of 4 mm or less (e.g., approximately 2 mm in the exemplary plasma etch embodiment) to facilitate coupling with a chuck electrode, as described further elsewhere herein. In one embodiment where the center conductor 222 is a wire of 2-4 mm, the center conductor 222 is brass for improved mechanical properties (e.g., stiffness and toughness) relative to copper, gold, or many other metals. In a further embodiment the RF transmission line 226 includes copper plated with gold. In the exemplary embodiment, the ground plane conductor 230 forms a rigid conductive shell around the center conductor 222 and RF transmission line 226 enabling the RF/DC rod assembly 128 to be removably affixed into mated seating cavity in the chuck assembly 142. In one such embodiment the ground plane conductor 230 is aluminum, though other materials, such as a stainless steel, may also be employed for the ground plane conductor 230.

The first insulation 224 and the second insulation 228 may be any material conventional for such a purpose. Generally, the first and second insulations 224 and 228 are to have a breakdown field strength sufficient to resist breakdown between the center conductor 222 and ground plane conductor 230, as dependent on the voltages to be carried by the center conductor 222. Second insulation 228 is further to limit heating of the ground plane conductor by the RF transmission line 226. In particular embodiments where the center conductor 222 is to carry a voltage of 250V or more, the majority of the dielectric strength is provided by the second insulation 228 having a thickness 3-5 times the thickness of the first insulation 224. As illustrated in FIG. 2, because the second insulator 228 extends beyond an annular end of the ground plane conductor 230A, dielectric materials having a high mechanical hardness are preferred so that the RF/DC rod assembly may be seated into a mating recess of the chuck assembly 142. In the exemplary embodiment, the second insulator 228 is a polytetrafluoroethylene (PTFE). While the first insulator 224 may also be a PTFE, materials with lower dielectric strength and physical hardness may also be used, such as but not limited to, conventional plastic dielectric wrapping materials.

Figure 3:
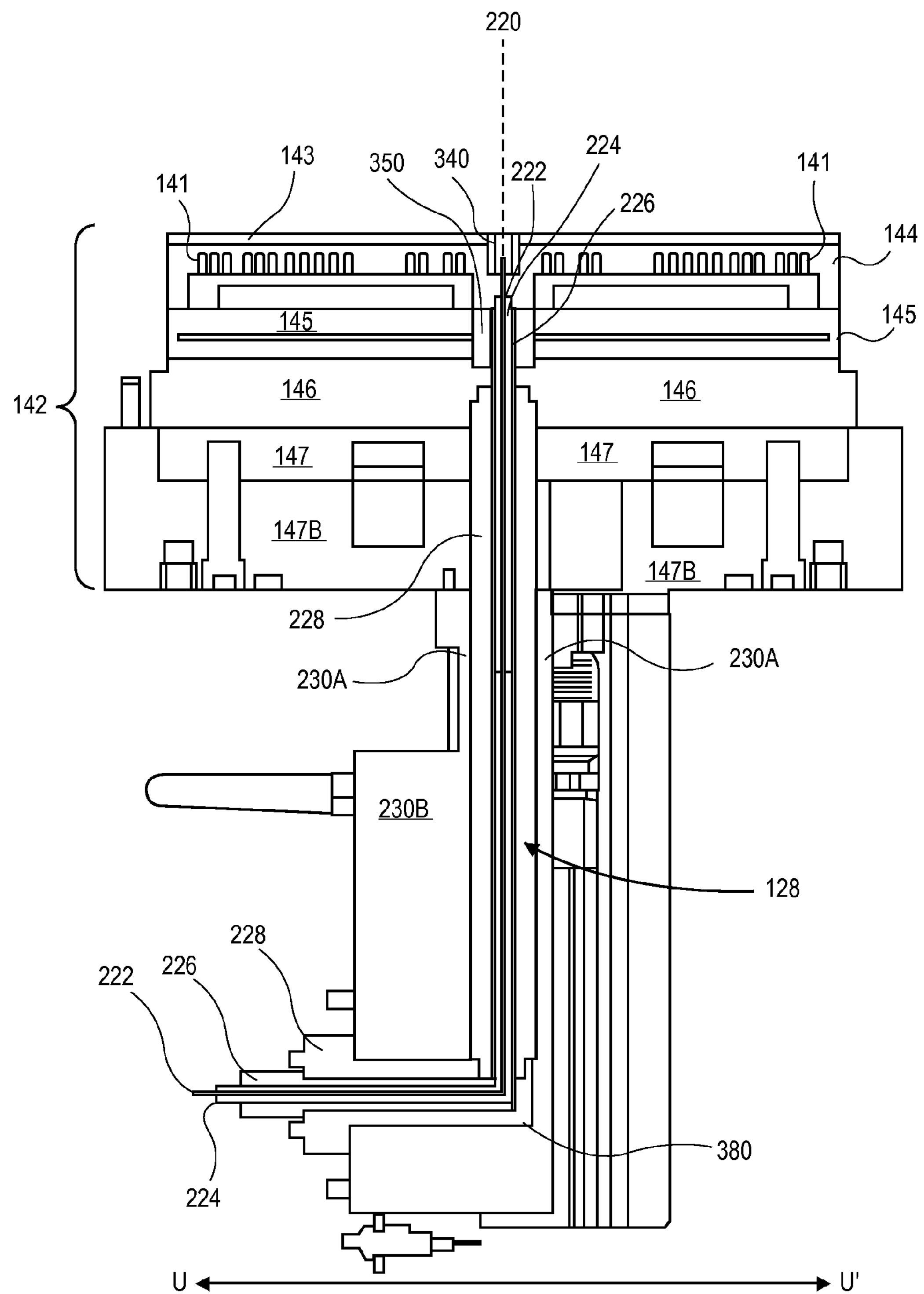
FIG. 3 illustrates a cross-sectional view of the RF/DC assembly depicted in FIG. 2 seated into a chuck assembly, in accordance with an embodiment of the present invention.
Figure 4:
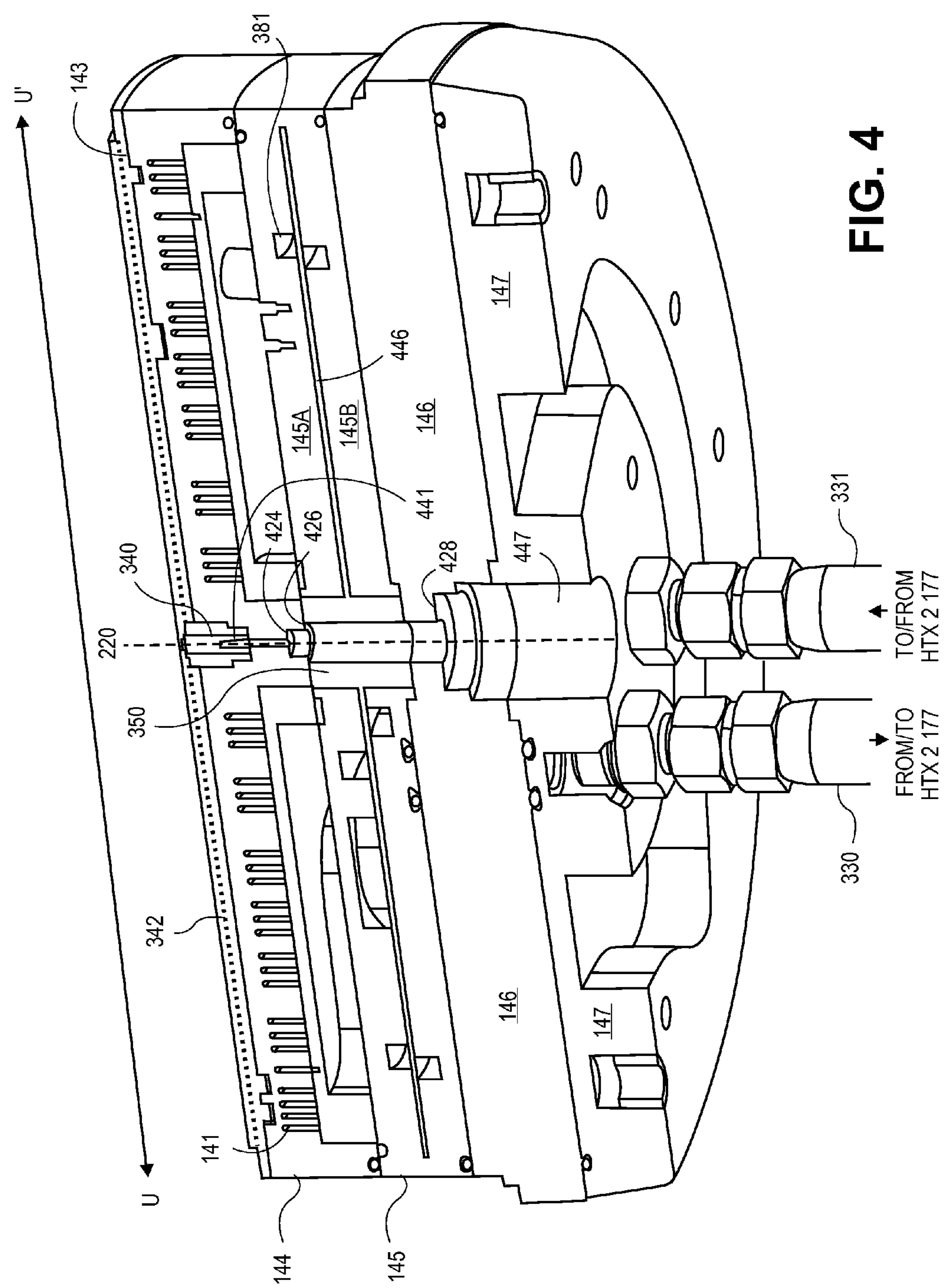
FIG. 4 illustrates a sectional view of the chuck assembly depicted in FIG. 3 illustrating mating surfaces for the RF/DC rod assembly illustrated in FIGS. 2 and 3, in accordance with an embodiment of the present invention.

In one exemplary embodiment, the center conductor 222 is to be coupled to a chuck electrode disposed above a base which is to be coupled to the RF transmission line 226. FIG. 3 illustrates a cross-sectional view along a center plane U-U' passing through the central axis 220 of the RF/DC rod assembly 128 seated into the chuck assembly 142, in accordance with an embodiment of the present invention. FIG. 4 illustrates an isometric sectional view of the chuck assembly 142 without the RF/DC rod inserted to illustrate the mating surfaces for the RF/DC rod assembly 128. As illustrated in FIGS. 3 and 4, the triaxial conductor arrangement of the RF/DC rod assembly enables a ground conductor connection at a first (lowest) level of the chuck assembly 142, an RF power connection at a second (middle) level of the chuck assembly 142, and a DC voltage connection at a third (top) level of the chuck assembly 142.

Referring to FIGS. 3 and 4, a top surface of the chuck assembly 142 is provided by a dielectric layer 143. Generally, the dielectric layer 143 is akin to a puck having features milled into the bottom side. Embedded within the dielectric layer 143 is a chuck electrode connector 340 disposed along the central axis 220 and providing a recess 441 (FIG. 4) into which the center conductor 222 is seated. The chuck electrode connector 340 is further electrically coupled to a chuck electrode 342, which in certain embodiments is a wire mesh. Depending on the embodiment, the chuck electrode 324 may be only 0.020-0.050 inches from the top surface of the dielectric layer 143 and it is the chuck electrode connector 340 which is to receive the center conductor 222 (e.g., a 2 mm wire) at a distance below the chuck electrode 342. The dielectric layer 143 may further provide a recess 424 (FIG. 4) into which the first insulator 224 is seated. Below the dielectric layer 143 are cooling and or heating elements, such as the fluid conduits 141, in a cooling channel base 144.

Disposed below the dielectric layer 143 (and cooling channel base 144) is an RF powered base 145 which may further comprise an assembly of multiple plates for distribution of a heat transfer fluid to/from the fluid conduits 141. In embodiments, the RF powered base 145 is a conductive material, such as aluminum, and is machined to include one or more levels of conduit forming manifolds 381. In a further embodiment, the RF powered base 145 is an assembly of first and second aluminum plates 145A, 145B, with an intervening plate 446 there between, and each of the first and second aluminum plates 145A, 145B having fluid conduit channels passing through thicknesses of the plates.

In an embodiment, an outer surface of the RF transmission line 226 makes physical contact with an inner surface of the RF powered base 145. RF power transmission occurs through rod contact with the center hole in the RF powered base 145. For example, as shown in FIGS. 3 and 4, an inner diameter of the annular RF powered base 145 surrounds a collar coupling 350 which is of a material having high electrical conductivity, such as aluminum, copper, etc. In further embodiments, the RF transmission line 226 may include a coupling 227 (FIG. 2) which is dimensioned to press fit into the RF transmission line seat 426 (FIG. 4).

Below the RF powered base 145 is an insulator layer 146. The insulator layer 146 serves to insulate a ground plane 147, which is to be maintained at ground potential, from the chuck electrode 342. The insulator layer 146 allows the dielectric layer 143 to be thinned so that the fluid conduits 141 may be placed very close to the top surface for improved cooling of a workpiece. The insulator layer 146 may be any dielectric material compatible with such a purpose, such as, but not limited to ceramics, quartz, plastics, etc. As shown in FIG. 4, the insulator layer 146 is annular in shape and machined to have a recess 428 which mates with an annular end of the second insulator 228 and clears the outer diameter of the RF transmission line 226.

The ground plane 147 disposed below insulator layer 146 is also annular in shape. The ground plane 147 may be of any conductive material, such as, but not limited to, aluminum or stainless steel. The ground plane 147 has an inner surface 447 machined along the central axis 220 to clear the outer diameter of the second insulator layer 228. As further shown in FIG. 4, the ground plane 147 may be adapted to mechanically couple heat transfer input/outputs 330, 331 via one or more electrically conductive base plates 147B (FIG. 3). To complete the electrical and mechanical interface between the RF/DC rod assembly 128 and chuck assembly 142, the ground plane conductor 230A mechanically and electrically couples to a bottom surface of the ground plane 147.

As further illustrated in FIG. 3, within the housing provided by the ground plane conductor 230A and 230B, each of the center conductor 222 and RF transmission line 226 make a right angle bend 380. In a particular embodiment, the right angle bend 380 is achieved by coupling first components of the respective members of the RF/DC rod assembly 128 having axial lengths along the central axis 220 with second components having axial lengths orthogonal to the central axis 220. For example, either the first or second components of each of the center conductor 222, first insulator 224, RF transmission line 226 and second insulator 228 may be machined with a side opening dimensioned to accommodate an end of the other of the first or second components. As illustrated in FIG. 3, the first component of second insulator 228 is disposed into an opening on a side of the second component of the second insulator 228. Similar joints are then formed between first and second components of the RF transmission line 226 and center conductor 222.

Features of a triaxial RF/DC rod assembly for delivery of RF power and DC voltage to a chuck assembly in a processing chamber are described. Although the present invention has been described in language specific to structural features and/or methodological acts, it is to be understood that the invention defined in the appended claims is not necessarily limited to the specific features and embodiments described. Accordingly, the foregoing description is by way of example only and is not intended as limiting. The invention is limited only as defined in the following claims and the equivalents thereto.

What is claimed is:

1. An electrostatic chuck assembly for supporting a workpiece during a manufacturing operation, the chuck assembly comprising:

a top surface to support the workpiece;

a chuck electrode disposed below the top surface;

a base disposed below the top surface; and a triaxial rod assembly coupled to the chuck below the top surface, the triaxial rod assembly further comprising;

a center conductor coupled to the chuck electrode;

an RF transmission line concentrically surrounding the center conductor with a first insulator there between, the RF transmission line coupled to the base; and a ground plane conductor concentrically surrounding the RF transmission line with a second insulator there between, the ground plane conductor coupled to a ground plane of the chuck.

2. The chuck assembly of claim 1, wherein the center conductor comprises a brass wire having an outer diameter of 4 mm or less.

3. The chuck assembly of claim 1, wherein the RF transmission line has a characteristic impedance of approximately 50 ohm.

4. The chuck assembly of claim 3, wherein RF transmission line comprises copper.

5. The chuck assembly of claim 4, wherein the RF transmission line is gold plated.

6. The chuck assembly of claim 1, wherein the ground plane conductor forms a rigid conductive shell.

7. The chuck assembly of claim 6, wherein the ground plane conductor comprises aluminum.

8. The chuck assembly of claim 6, wherein the center conductor and RF transmission line form right angle bends.

9. The chuck assembly of claim 1, wherein the chuck electrode is disposed above the base.

10. The chuck assembly of claim 9, wherein the top surface is ceramic and the second insulator is PTFE.

11. A plasma processing apparatus, comprising:

a chamber to expose a workpiece to a plasma environment; and a chuck assembly including a chuck electrode, a base, and a ground plane;

a DC power supply;

an RF power supply; and a triaxial rod assembly coupling the chuck assembly to the power supplies, the triaxial rod assembly further comprising;

a center wire electrically coupling the chuck electrode to a first terminal of the DC power supply;

an RF transmission line concentrically surrounding the center wire with a first insulator there between, the RF transmission line electrically coupling the base to the RF power supply; and a ground plane conductor concentrically surrounding the RF transmission line with a second insulator there between, the ground plane conductor electrically coupling the ground plane of the chuck assembly to a ground terminal of the DC power supply.

12. The apparatus of claim 11, wherein the triaxial rod assembly is affixed to a central axis of the chuck, wherein the base comprises an annular electrically conductive plate disposed below the chuck electrode with a dielectric layer there between, and wherein an outer surface the RF transmission line is in electrical contact with an inner surface of the inner diameter of the annular base.

13. The apparatus of claim 12, wherein the chuck electrode comprises a wire mesh disposed in the dielectric layer, and wherein the center wire extends an axial distance beyond a plane of the base to seat into a conductive connector embedded in the dielectric layer, the conductive connector electrically coupled to the wire mesh.

14. The apparatus of claim 11, wherein the chuck assembly further comprises an annular ground plane disposed below the annular base with an annular insulator disposed there between, and wherein an end of the second insulator is seated into the annular insulator with a outer surface of the second insulator passing through an inner surface of the annular ground plane along an axial length of the ground plane conductor.

15. The apparatus of claim 11, wherein the base further comprises an assembly of first and second aluminum plates with an intervening plate there between, each of the first and second aluminum plates having fluid conduit channels passing through an axial thickness of the plates.

16. The apparatus of claim 11, wherein the center conductor comprises a brass wire having an outer diameter of 4 mm or less, wherein RF transmission line comprises copper and wherein the ground plane conductor is a rigid aluminum housing.

17. The apparatus of claim 11, wherein the triaxial rod assembly forms a right angle bend.

18. The apparatus of claim 11, wherein the second insulator is plastic.

19. The apparatus of claim 11, wherein the DC power supply is to provide a chucking voltage of at least 250V.

20. The apparatus of claim 11, further comprising a controller to control at least one of: an RF power delivered by the RF transmission line or a DC voltage potential between the center wire and the ground plane conductor while executing a plasma etch process on a workpiece.

* * * * *